METHOD OF PRODUCING SEMICONDUCTOR DEVICES

Filed Aug. 21, 1963

INVENTOR.
Takeshi Tagaki
Masatoshi Migitaka
BY Hiroshi Ueda
Hirokazu Kimura

BY Mestern + Mestern Atts

United States Patent Office 3,298,880
Patented Jan. 17, 1967

3,298,880

METHOD OF PRODUCING SEMICONDUCTOR DEVICES

Takeshi Takagi, Musashino-shi, Masatoshi Migitaka and Hiroshi Ueda, Tokyo-to, and Hirokazu Kimura, Koganei-shi, Japan, assignors to Kabushiki Kaisha Hitachi Seisakusho, Chiyoda-ku, Tokyo-to, Japan, a joint-stock company of Japan Filed Aug. 21, 1963, Ser. No. 303,516
Claims priority, application Japan, Aug. 24, 1962, 37/35,072; Aug. 27, 1962, 37/35,277
2 Claims. (Cl. 148—191)

Figures 1, 2, 3, 4, 5, 6, 7:
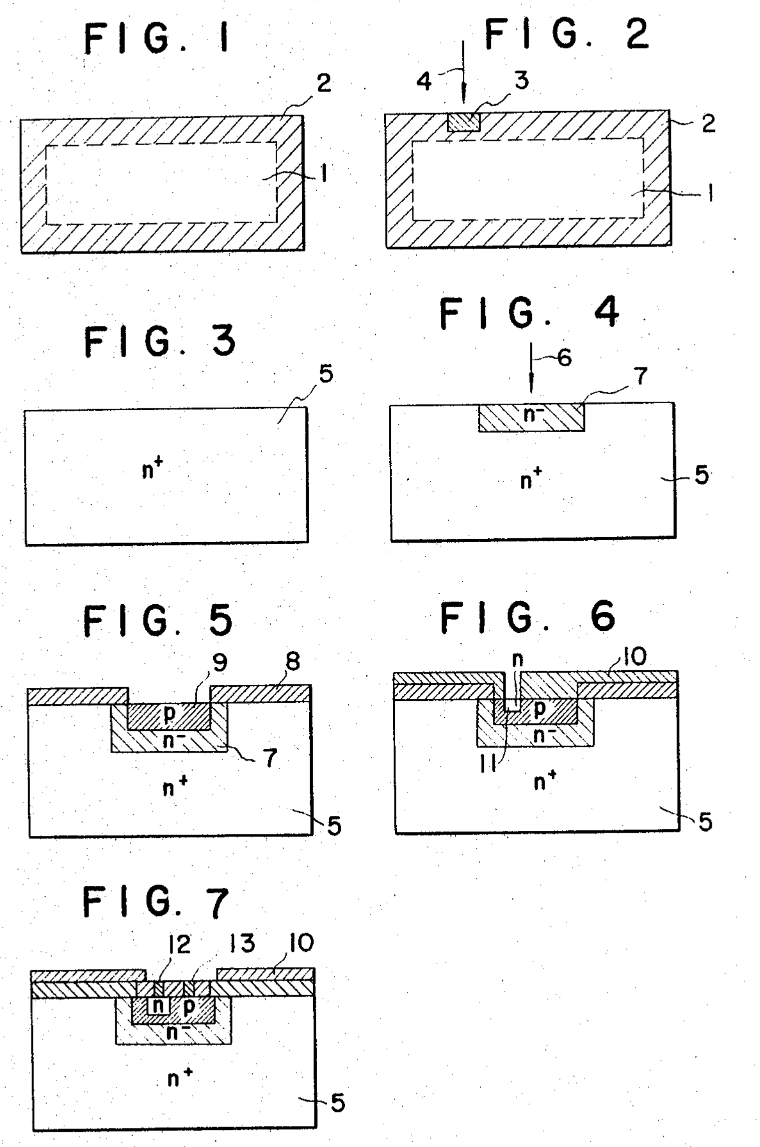

This invention relates to techniques in the production of semiconductor devices by the so-called diffusion method, and more particularly it relates to a new method of producing semiconductor devices wherein an electron beam is used as the means for causing impurities to diffuse in a semiconductor substratum or for causing impurities already contained in such a semiconductor substratum to undergo so-called out-diffusion into the outside space.

Heretofore, the following methods of producing semiconductor devices by the diffusion method have been principally resorted to.

(1) The method which comprises causing an active impurity to diffuse in the entire surface region of a semiconductor substratum to create a diffused layer of the desired conductive type, covering only a desired region of this diffused layer with an etch-proof wax or the like, removing the remaining exposed diffused layer by a suitable method such as chemical etching, and utilizing only the desired part.

(2) The method which comprises exposing only a desired part of the surface region of a semiconductor substratum, covering the other parts with silicon oxide film, and forming a diffused layer in only the said exposed part by utilizing the masking effect of the said film with respect to impurities.

(3) The so-called out-diffusion method which comprises causing a portion of an active impurity contained in a semi-conductor substratum to diffuse outwardly and escape from a desired part of the said substratum.

These methods, as practiced heretofore, have required delicate photo-etching techniques and complicated process steps during the forming of the various above-mentioned diffused layers in order to control their configurations and sizes. Moreover, junctions formed by the above-mentioned diffusion methods tend to become so-called graded junctions wherein the impurity gradients of the acceptor and donor impurities are gradual, and it is extremely difficult to produce abrupt or step junctions.

By the alloying method, on one hand, although it is possible, after the alloying process, to form a regrowth region of a desired size on the surface of a base semiconductor, said region having characteristics different from those of the said semiconductor and having a relatively uniform impurity distribution, a region of a substance having the metal used as its principal constituent is created on the surface layer. Unless this region is removed, subsequent processes, such as forming on the said regrowth region another region of a different conductivity type, cannot be carried out.

On the other hand, by the epitaxial crystal growth method it is possible to form a surface layer of uniform impurity concentration without the formation of a metallic layer which must be removed as in the case of the alloy method. For this reason, epitaxial-mesa type and epitaxial-planar type transistors have been developed through diffusion treatment on epitaxial surfaces. By the epitaxial crystal regrowth method, however, the growth layer can be formed only in a uniform manner over the entire layer, and, moreover, there is a limitation to the purity of the layer. Accordingly, in the present state of the art, it is difficult to grow an epitaxial layer having characteristics superior to those of the semiconductor crystal substratum, and a growth layer having numerous defects are produced by the technique practiced heretofore.

It is an object of the present invention to overcome the above-mentioned difficulties attendant to the formation in the proximity of a semiconductor surface a layer of different characteristics. More specifically, it is an object to provide a new method of producing semiconductor devices which requires relatively simple and economical process steps to produce semiconductor devices having highly desirable characteristics.

It is another object to provide a method as stated above which affords accomplishment of diffusion processes in a relatively short time.

It is still another object to provide a method as stated above in which a high degree of control precision can be readily attained.

It is a further object to provide a method as stated above by which abrupt or step junctions can be readily formed.

The foregoing objects, as well as other objects and advantages as will presently become apparent, have been achieved by the present invention, which, briefly described, provides a method of producing semiconductor devices which comprises irradiating and heating with an electron beam any desired region of a semiconductor substratum and thereafter introducing an active impurity gas to the region so heated by the electron beam to cause impurity diffusion in only the said heated region; or locally heating only a certain region of a semiconductor material by means of an electron beam so as to cause an impurity already existing within the said semiconductor material to undergo out-diffusion from the surface of the said material. It has been found that the above-stated out-diffusion can be accomplished with greater effectiveness by introducing a halogen gas to the heated region during the above-described process.

The nature, principle, and details of the invention will be more clearly apparent by reference to the following description of examples of preferred embodiments of the invention, when taken in connection with the accompanying drawing in which like parts are designated by like reference numerals and letters, and in which:

FIGS. 1 and 2 are vertical sectional views illustrating one example of embodiment of the method according to the invention and indicating process steps in the fabrication of a mesa type transistor; and FIGS. 3 through 7, inclusive, are vertical sectional views illustrating another example of embodiment and indicating process steps in the fabrication of a planar type transistor.

EXAMPLE 1

An n-type silicon wafer 1 of 0.2-mm. thickness and 1-ohm-cm. specific resistance, as shown in FIG. 1, was prepared as a silicon base, which was then subjected to diffusion with boron from the outside atmosphere by a known method of producing a p-type layer 2 of approximately 3-micron depth.

Next, in an electron beam apparatus, a region 3 (of 50-micron width and 200-micron length) at one part of the semiconductor substratum was heated by an electron beam 4 at a temperature below the melting point of the semiconductor. Then, with the semiconductor in this state, $P_2O_5$ as a gas was introduced to the vicinity of the heated region 3 for 20 seconds, whereupon an n-type converted region of approximately 2-micron depth was obtained in only the heated region. The irradiation by the electron beam then was terminated. Subsequently, the semiconductor specimen was assembled by the same known method as that for the mesa-type transistor.

EXAMPLE 2

An n-type silicon base 5 (FIG. 3) doped with phosphorus and having a 0.2-mm. thickness and 0.005-ohm cm. specific resistance was prepared and subjected to local heating for approximately 30 seconds by an electron beam 6 (FIG. 4) to cause out-diffusion of the phosphorus within the base into the external atmosphere. (It has been found that the out-diffusion of the phosphorus can be promoted by supplying chlorine gas to the specimen during this process.) In this part 7 (FIG. 4), the specific resistance rose to 2 ohm cm. as a natural result.

Next, as shown in FIG. 5 a silicon oxide film 8 was formed by a known method on a desired part on the surface of the base 5, and then, by causing boron to diffuse, by the method set forth in Example 1, only in the region 7 of increased resistivity, a p-type layer 9 was selectively formed. By similarly causing selective vapor-phase diffusion of phosphorus, an n-type layer 11 was formed, whereby it was possible to produce an $n^+n^-pn$ construction as shown in FIG. 6. During the phosphorus diffusion step in the formation of the layer 11, an oxide film 10 was formed.

Finally, by selectively removing the oxide film by a known method from the base wafer in the state shown in FIG. 6 and by causing aluminum to deposit by evaporation to serve as the emitter electrode 12 and the base electrode 13, it was possible to obtain a transistor of $npn^-n^+$ construction as shown in FIG. 7 without the use of the epitaxial crystal regrowth method.

As will be apparent from the foregoing disclosure based on specific examples of embodiment, in the method of the present invention, an electron beam is used as the heating means. Accordingly, it is possible to accomplish local diffusion without the use of photo-etching techniques and exercise precise control of the diffusion region. Furthermore, the interface between the region which is restricted to the surface of the specimen and into which an impurity has been introduced and the substratum is distinct. Accordingly, it is possible to form an abrupt or step junction by the diffusion method according to this invention.

It is to be observed further that, by the method of this invention wherein an electron beam is used, it is possible to create locally a layer of high specific resistance on the surface of a semiconductor, whereby a planar type transistor of low collector series resistance can be obtained without the use of an epitaxial single-crystal for the substrate. The use of an electron beam according to the present invention affords other advantages such as, for example, the possibility of readily forming an out-diffusion region of infinitesimal area on any desired point on the surface of a semiconductor base, which formation cannot be readily accomplished by ordinary methods, and the possibility of establishing an integrated series of work processes by combining the above-described process with other process steps.

It should be understood, of course, that the foregoing disclosure relates to only specific examples of preferred embodiments of the invention and that it is intended to cover all changes and modifications of the examples of the invention herein chosen for the purposes of the disclosure, which do not constitute departures from the spirit and scope of the invention as set forth in the appended claims.

What is claimed is:

1. A method of producing semiconductor devices which comprises the steps of: locally heating a particular region of a semiconductor material containing an active impurity by means of an electron beam; establishing an atmosphere selected from the group consisting of gaseous halogen and gaseous $P_2O_5$ to assist and promote outward diffusion about said particular region; and maintaining heating until said outward diffusion is terminated.

2. The method as defined in claim 1 wherein said gaseous atmosphere is maintained for substantially 3 to 20 seconds.

References Cited by the Examiner

UNITED STATES PATENTS

| | | | |
|---|---|---|---|
| 2,816,847 | 12/1957 | Shockley | 148—1.5 |
| 2,845,371 | 7/1958 | Smith | 148—191 |
| 2,980,560 | 4/1961 | Weiser | 148—191 |
| 3,007,816 | 11/1961 | McNamara | 148—189 |
| 3,015,590 | 1/1962 | Fuller | 148—189 |

OTHER REFERENCES

Aschner et al., J. of the Electrochemical Society, May 1959, pages 415–417.

HYLAND BIZOT, *Primary Examiner.*

DAVID L. RECK, *Examiner.*